United States Patent [19]
Sanchez

[11] Patent Number: 5,340,011
[45] Date of Patent: Aug. 23, 1994

[54] ADJUSTABLE HEIGHT WORK HOLDER FOR BONDING SEMICONDUCTOR DIES

[75] Inventor: Antonio Sanchez, Ripon, Calif.

[73] Assignee: LSI Logic Corporation, Milpitas, Calif.

[21] Appl. No.: 988,299

[22] Filed: Dec. 9, 1992

[51] Int. Cl.⁵ .............................................. B23K 37/04
[52] U.S. Cl. ..................................... 228/4.5; 228/49.5; 228/56.5
[58] Field of Search ................. 228/4.5, 6.2, 47, 1.1, 228/105, 179, 56.5, 49.5; 269/60, 76

[56] References Cited

U.S. PATENT DOCUMENTS 3,995,845  12/1976  Scheffer ............................ 228/179

FOREIGN PATENT DOCUMENTS 144941    7/1985   Japan ............................... 228/4.5
8304201  12/1983   PCT Int'l Appl. .................. 228/4.5

OTHER PUBLICATIONS

Die Bonding, MMT, pp. 21-31, Aug. 1991.

Primary Examiner—Samuel M. Heinrich
Attorney, Agent, or Firm—Gerald E. Linden

[57] ABSTRACT

In a semiconductor wire bonder, the need for frequently changing chucks and re-focusing optical equipment for each different die/package thickness combination is alleviated by providing an adjustable stop mechanism lifting the upward displacement of the die/package off of a carrier. The adjustable stop mechanism includes a first, stationary bracket having a leg extending towards a movable lifting member of the bonder, and a second bracket mounted to the movable lifting member. A set screw extending through the leg of the first bracket limits the upward movement of the movable member, and ensures that the front surface of a die being bonded is at an optimum position for bonding.

16 Claims, 2 Drawing Sheets

ADJUSTABLE HEIGHT WORK HOLDER FOR BONDING SEMICONDUCTOR DIES

TECHNICAL FIELD OF THE INVENTION

The invention relates to the packaging of integrated circuit (IC) semiconductor devices, and more particularly to techniques for connecting (wire bonding) semiconductor die pads to package terminals.

BACKGROUND OF THE INVENTION

The term die bonding describes the basic operation of attaching a semiconductor die to its package, or to some other substrate such as a tape carrier for tape automated bonding (TAB). First, the die is picked from either a diced wafer or a storage station, then it is aligned to a target pad on a carrier or substrate. It is then permanently attached to the substrate, usually by means of either a eutectic or epoxy bond.

For wire bonding, automated machinery connects a fine wire between pads on the die and terminals typically within the package. Many modern die bonders employ sophisticated positioning equipment together with a wide variety of optical-enhancement or machine-vision techniques to acquire and place the die, and to guide subsequent wire bonding operations.

One common wire bonding operation is referred to as "aluminum wedge bonding". A suitable apparatus for performing such bonding is bonder part number SWB-FA-US-30, available from Shinkawa Corporation of Japan. For purposes of the discussion that follows, the Shinkawa bonder is exemplary.

The bonder has a rotary table mounted with a chuck. The chuck holds the semiconductor package with the die already mounted therein. The rotary table includes a mechanism for raising the chuck, hence the die, to a predetermined height referred to as a "bonding level". A bonding tool places one end of an aluminum wire in contact with the pad (e.g.) to be bonded, and ultrasonic energy effects bonding of the wire to the pad. The bonding tool then moves to another location, and bonds another end of the wire to a package terminal (e.g.). In order to position the bonding tool at various locations in the plane of the die/package, either the rotary table is indexed about its axis, or the bonding tool itself is able to move in an X-Y direction. A mechanism is also provided for moving the bonding tool vertically, normal to the die plane, in the Z axis, so that the bonding tool can vary its height above the die between bonds.

During the bonding operation, the front surface of the die being bonded is required to be maintained at a fairly precise level (see point "P" in FIG. 2). This is due, in part, to a small depth of field in optical-enhancement or machine-vision apparatus associated with the bonder. The optimal vertical position of the die is established by selecting from a number of different height chucks. Thicker packages require shorter chucks, and vice-versa, and each chuck can accommodate only a narrow range of packages. (This assumes that the die thickness is constant.) In other words, changing from chuck-to-chuck is a rather coarse step function.

This limitation on vertical positioning of the die creates problems when a variety of package types having different package thicknesses are processed on the same bonder. Use of the "wrong" chuck may require the bonding tool to be lowered outside of its optimal range. Additionally, for each change is die or package thickness, the operator must re-focus the optical equipment. This represents non-productive use of available bonder time. While chucks having a variety of heights are supplied with the bonder, the need to constantly be selecting the proper chuck from a large assortment of chucks is in and of itself an additional nuisance and time-consuming task.

DISCLOSURE OF THE INVENTION

It is therefore an object of the present invention to provide an improved technique for wire bonding a die to a package.

It is another object of the present invention to provide an improved technique for aluminum wedge bonding.

It is another object of the present invention to provide a bonding technique that eliminates the need to re-focus the optical equipment in a bonder.

It is another object of the present invention to provide a bonding technique that eliminates the need to change chucks in a bonder, when changing package/die configurations.

According to the invention, a bonder includes a carrier for supporting a semiconductor die and package, a bonding tool for effecting bonding between die pads and package terminals, and an optical system for monitoring the bonding operation. The bonder also includes a rotary table, for rotationally positioning the die/package with respect to the bonding tool. The carrier includes a height adjustment mechanism for positioning the front surface of the die to be bonded at an optimal point ("P") within the vertical range of the bonding tool and the optical system.

The height adjustment mechanism includes a mechanism already present on the bonder which elevates the die/package from the carrier, in one "gross" step, up towards the bonding tool. The height mechanism further includes two brackets and a set screw, which together act as a variable "stop" to limit the upward displacement of the die/package. The set screw has a fine pitch, allowing the operator to cause the front surface of the die being bonded to be precisely located at the proper bonding level "P".

The ability to vary the height of the die over a wide range of adjustment, allows for different package types and thicknesses and/or different thickness dies to be vertically positioned at an optimal position "P" in the bonder, without changing chucks, and also alleviates the need to completely re-focus the optical system. Regarding the latter, this is akin to bringing "Mohammed" (the die) to the "mountain" (the proper location in the bonder), rather than bringing the mountain to Mohammed.

Other objects, features and advantages of the invention will become apparent in light of the following description thereof.

DETAILED DESCRIPTION OF THE INVENTION

Figure 1:
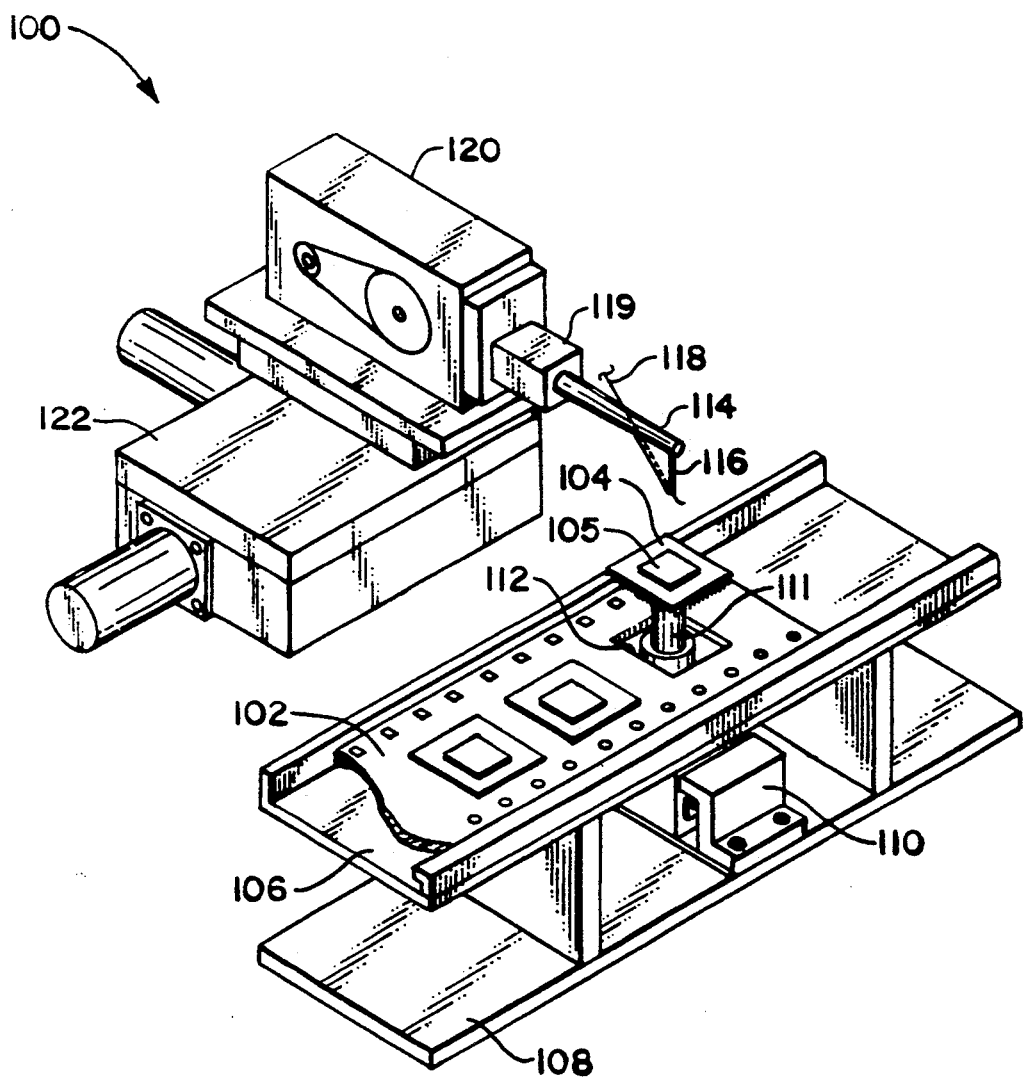
FIG. 1 is a perspective view of a typical bonder of the prior art.

FIG. 1 shows a stylized aluminum wedge bonder 100, such as the aforementioned Shinkawa SWB-FA-US-30. The bonder 100 includes a carrier 102 for transporting a series of semiconductor packages 104 (only one shown) to and away from a location underneath a bonding tool 114. A die 105 is disposed within the package. The carrier 102 is disposed in a track 106, and a transport mechanism (not shown) effects movement of the carrier. The track mechanism is not particularly germane to the present invention.

The bonder 100 also includes a rotary table 110 upon which is disposed a chuck 111 for supporting the semiconductor package. An opening 112 in the carrier 102 allows the chuck 111 to lift the package 104 off the carrier into a higher vertical position for performing the bonding operation.

The bonding tool 114 includes an ultrasonic transducer 119 and a wedge 116. A fine (on the order of 0.0008 inches) wire 118 feeds through the wedge 116, and is supplied by a wire feed mechanism (not shown). The vertical position (Z axis) of the bonding tool 114 is controlled by a mechanism 120, and an X-Y positioning table 122 controls the in-plane (with respect to the die) position of the bonding tool 114. A camera and monitor (not shown), or other suitable optical system is provided to ensure that the wedge 116 and wire 118 are correctly positioned above a pad (not shown) on the die 105 or a terminal (not shown) in the package 104. A control system (not shown) controls rotation of the table 110, the vertical lifting operation of the chuck 111, the in-plane position of the X-Y table 122, and the vertical positioning of the bond tool 114.

As mentioned hereinbefore, the rotary table and chuck mechanisms are not provided with capability of positioning the package at a prescribed distance from the bond tool (other than the vertical displacement involved in lifting the package off of the carrier). Due to this limitation, it has been necessary to fit various size (height) chucks to the rotary table in order to bring the front surface of the die to be bonded to a prescribed distance from the bonding tool.

Figure 2:
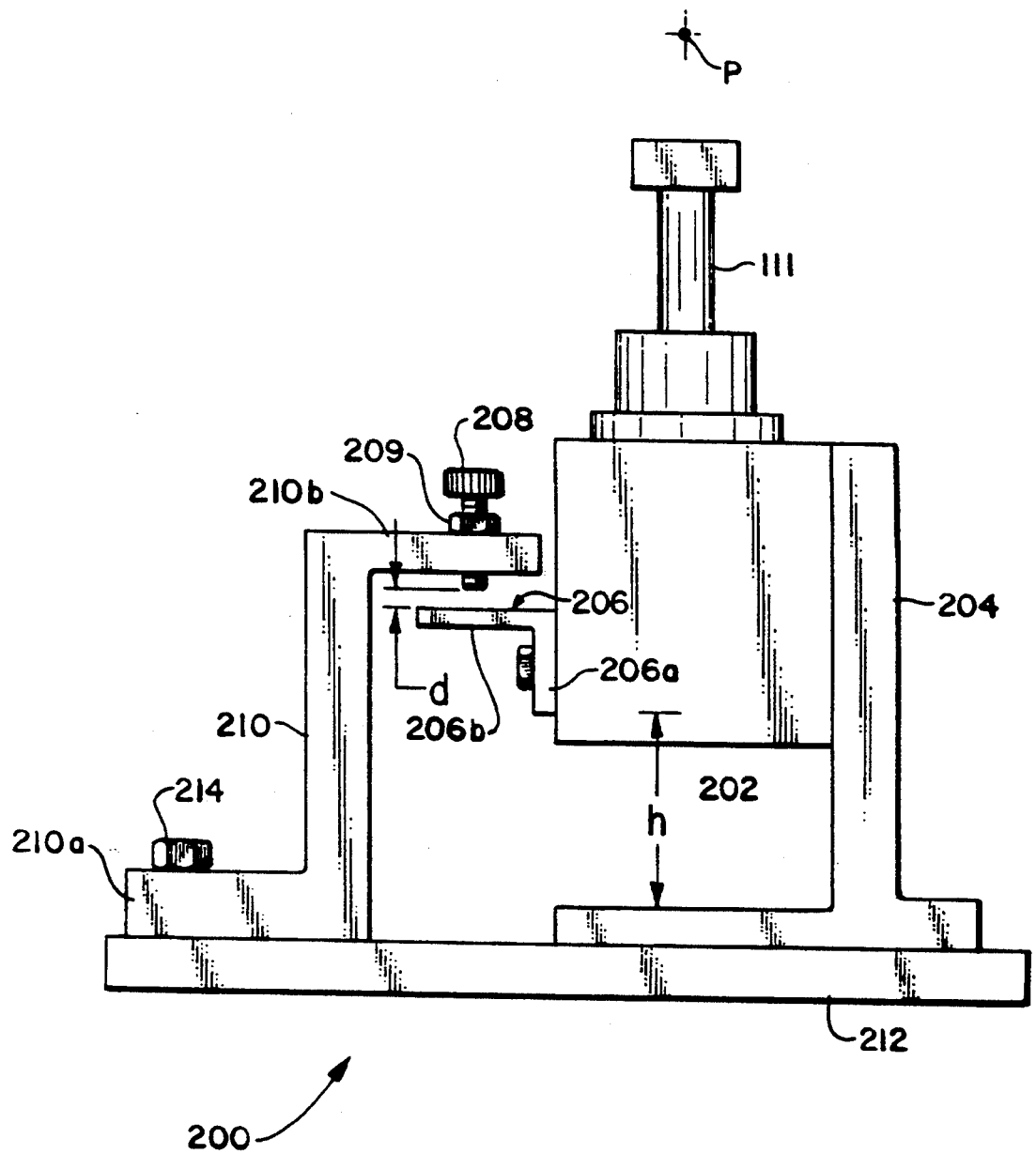
FIG. 2 is a side elevational view of the height adjustment mechanism of the present invention.

FIG. 2 shows the adjustable height work holder 200 of the present invention, suitable for adaptation to the bonder 100 of FIG. 1. References to FIG. 1 are made in the following description.

A stationary member 204 is mounted to a base member 212, which is fixed with respect to the bonder 100. A chuck is disposed atop a movable member 202, and the movable member 202 is capable of moving vertically up and down the stationary member 204 to the extent necessary to lift a semiconductor package 104 off of a carrier 102. As described with respect to the bonder 100 of FIG. 1, the movable member 202 includes a mechanism (not shown) for rotationally positioning a package 104 supported by the chuck 110.

Regarding the ability of the movable member 202 to elevate the die/package, it should be understood that this is a "gross" function in that the mechanism (not shown) for performing this function is generally only able to lift the die/package a from a bottom position (on the carrier) to a top position a distance "h" (on the order of 0.5 inch) above the bottom position. This is the chuck's "maximum" range of travel, under normal circumstances.

According to the invention, another mechanism is incorporated to limit the upward travel of the chuck 111, thereby allowing the front face of a die being bonded to be set at a pre-established bond height with respect to the bond tool 114, namely at a position "P".

As shown in FIG. 2, a Z-shaped bracket 210 is mounted to the base member 212 and extends upwardly away from the base member. One leg 210a of the bracket 210 is secured to the base member 212 with a screw 214. Another leg 210b of the bracket 210 extends towards the movable member 202. A fine pitch set screw 208 extends through the leg 210b from above the leg 210b, and is provided with a thumb screw-type head. Another "L" shaped bracket 206 is secured by one leg 206a to the movable member 202, and has another leg 206b extending towards the first bracket 210. As shown in FIG. 2, the leg 210b of the bracket 210 is parallel to and overlaps the leg 206b of the bracket 206.

With the set screw 208 backed out, the top surface of the leg 206b will contact the undersurface of the leg 210b. This establishes an upper limit of travel, in any case, for a given chuck 111. The dimensions of the bracket 210, and the location of the bracket 206 on the movable member 202, and the chuck 111 are selected so that any conceivable combination of package and die (at least a wide range of package/die combinations) will be lifted sufficiently that the front surface of the die being bonded is just at or slightly above the point "P" (i.e., equal to or slightly less than a preferred distance from the bond tool).

As illustrated, the set screw 208 is screwed in to extend a distance "d" through the undersurface of the leg 210b. In this manner, the set screw acts as a variable, finely-adjustable "stop" to limit the upward travel of the movable member 202, and hence the chuck 111, and hence to establish a well-defined vertical position for the front face of the die being bonded. For thicker packages (assuming a constant die thickness), the set screw would be turned in more, increasing "d", so that the front surface of the die would still be at the point "P". In a manner of speaking, when the front surface of the die is at "P", "h" minus "d" equals some known number that is a function of the overall package/die thickness. This number can be determined empirically, once, by the operator. Alternatively, the operator, through experience, can turn the set screw 208 in further than necessary, and back it out until the front surface of the die comes into focus, as observed through the optical system.

In most cases, the set screw ought to remain in position, as set by the operator. Preferably, a lock nut 209 is provided, as shown, to ensure that the set screw does not back itself out of or advance itself into the leg 210b.

For extreme variations in package/die thickness, outside of the range of a particular chuck 11, it would be necessary to install another taller or shorter chuck. However, in practice, these situations should be few and far between. For "normal" variations in die/package thicknesses, these variations are readily accommodated by adjusting the set screw.

Evidently, the apparatus of the present invention provides a facile technique for accommodating a wide range of package/die combinations, without necessitating changing chucks for each different thickness combination and without re-focusing for each variation.

What is claimed is:

1. Apparatus for bonding a pad of a semiconductor die to a terminal of a semiconductor package, comprising:
   a carrier for holding a semiconductor die and a semiconductor package, said die having pads and said package having terminals;
   a rotary table having a movable member and a stationary member, said movable member having a chuck mounted thereon for coarsely lifting the die and package a maximum distance "h" above the carrier;

a height adjustment mechanism for finely adjusting the maximum vertical displacement of said chuck;

a bonding tool;

means for positioning said bonding tool such that a wire may be bonded between a selected die pad and a selected package terminal; and a camera and monitor for viewing the die pad and package terminal;

wherein the height adjustment mechanism includes:

a first bracket, fixed with respect to the movable member and having a first leg extending towards the movable member;

a second bracket, fixed to the movable member, and having a second leg extending towards the first bracket; and a set screw extending through the first leg, towards the second leg, and limiting the maximum upward vertical travel of the movable member.

2. Apparatus, according to claim 1, wherein:
the bonding tool includes a wedge.

3. Apparatus, according to claim 2, wherein:
the bonding tool includes an ultrasonic transducer.

4. Apparatus, according to claim 2, further comprising:
wire feeding through the wedge for connecting selected pads on the die to selected terminals on the package.

5. Apparatus, according to claim 1, wherein:
the maximum vertical displacement of said chuck corresponds to an optimum position for a front surface of the semiconductor die with respect to the bonding tool and the camera.

6. Apparatus, according to claim 1, wherein:
the height adjustment mechanism includes means for elevating the die from the carrier towards the bonding tool.

7. Apparatus, according to claim 1, wherein:
the first bracket is in the form of a "Z".

8. Apparatus, according to claim 1, wherein:
the second bracket is in the form of an "L".

9. Apparatus, according to claim 1, wherein:
the set screw limits the maximum upward travel of the movable member so that a die lifted by the chuck will be at a position "p", less than "h" above the carrier.

10. Apparatus, according to claim 9, wherein:
an end of the set screw contacts the second bracket to limit the upward travel of the movable member.

11. Apparatus, according to claim 1, wherein:
the first leg is parallel to the second leg.

12. Apparatus, according to claim 1, wherein:
the apparatus accommodate a wide range of package/die combinations, each having an overall thickness, without necessitating changing chucks for each different overall thickness combination and without re-focusing for each overall thickness combination.

13. Apparatus for bonding a pad of a semiconductor die to a terminal of a semiconductor package, comprising:

means for supporting a semiconductor die and a semiconductor package, said die having pads and said package having terminals;

means, including a movable member and a stationary member, for the movable member coarsely lifting the die and package a maximum distance "h" towards a bonding tool; and means, affixed to the movable and stationary members, for limiting the movement of the movable member.

14. Apparatus, according to claim 13, further comprising:
a camera and monitor for viewing the die pad and package terminal.

15. Apparatus, according to claim 13, further comprising:
a bonding tool; and
means for positioning said bonding tool such that a wire may be bonded between a selected die pad and a selected package terminal.

16. Apparatus, according to claim 13, wherein:
the means for limiting the movement of the movable member includes:

a first bracket, fixed with respect to the movable member and having a first leg extending towards the movable member;

a second bracket, fixed to the movable member, and having a second leg extending towards the first bracket; and a set screw extending through the first leg, towards the second leg, and limiting the maximum upward vertical travel of the movable member.

* * * * *